United States Patent
Honishi et al.

(10) Patent No.: US 12,310,119 B2
(45) Date of Patent: May 20, 2025

(54) SOLAR CELL, LAMINATED BODY, MULTI-JUNCTION SOLAR CELL, SOLAR CELL MODULE, AND SOLAR POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Yuya Honishi, Saitama Saitama (JP); Soichiro Shibasaki, Nerima Tokyo (JP); Naoyuki Nakagawa, Setagaya Tokyo (JP); Mutsuki Yamazaki, Yokohama Kanagawa (JP); Yoshiko Hiraoka, Kawasaki Kanagawa (JP); Kazushige Yamamoto, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 391 days.

(21) Appl. No.: 17/184,642

(22) Filed: Feb. 25, 2021

(65) Prior Publication Data

US 2021/0184066 A1    Jun. 17, 2021

Related U.S. Application Data

(63) Continuation of application No. PCT/JP2020/010296, filed on Mar. 10, 2020.

(30) Foreign Application Priority Data

Jul. 2, 2019    (JP) .................................. 2019-123900

(51) Int. Cl.
| | | |
|---|---|---|
| *H10F 10/161* | (2025.01) | |
| *H10F 10/16* | (2025.01) | |
| *H10F 77/70* | (2025.01) | |

(52) U.S. Cl.
CPC .......... *H10F 10/161* (2025.01); *H10F 10/16* (2025.01); *H10F 77/703* (2025.01)

(58) Field of Classification Search
CPC .......... H01L 31/0725; H01L 31/02363; H01L 31/0336
See application file for complete search history.

(56) References Cited

U.S. PATENT DOCUMENTS 8,907,206 B2 * 12/2014 Lee ..................... H01L 31/0725
136/265
2012/0138146 A1    6/2012 Furuhata et al.
(Continued)

FOREIGN PATENT DOCUMENTS

| CH | 262407 | 6/1949 |
|---|---|---|
| CN | 102214734 | 10/2011 |

(Continued)

OTHER PUBLICATIONS

Chen, Lung-Chien, "Review of preparation and optoelectronic characteristics of Cu2O-based solar cells with nanostructure", Materials Science in Semiconductor Processing 16, pp. 1172-1185. (Year: 2013).*

(Continued)

*Primary Examiner* — Tamir Ayad
(74) *Attorney, Agent, or Firm* — Amin, Turocy & Watson, LLP

(57) ABSTRACT

A solar cell according to an embodiment includes a first electrode being transparent, a first semiconductor layer on the first electrode, a second semiconductor layer on the first semiconductor layer, and a second electrode being transparent- (Continued)

ent on the second semiconductor layer, wherein grooves exist regularly on a surface of the first semiconductor layer facing a side of the second semiconductor layer.

12 Claims, 5 Drawing Sheets

(56) References Cited

U.S. PATENT DOCUMENTS

| | | | |
|---|---|---|---|
| 2014/0238479 | A1 | 8/2014 | Lim et al. |
| 2016/0076154 | A1* | 3/2016 | Hussaini .................. C25B 1/55 204/242 |
| 2019/0198697 | A1 | 6/2019 | Honishi et al. |
| 2021/0013360 | A1 | 1/2021 | Shibasaki et al. |

FOREIGN PATENT DOCUMENTS

| | | |
|---|---|---|
| CN | 106299131 | 1/2017 |
| JP | 2002-319688 | 10/2002 |
| JP | 2019-057536 | 4/2019 |
| JP | 2020-145426 | 9/2020 |
| KR | 10-2013-0013773 | 2/2013 |
| KR | 10-1848319 | 4/2018 |
| WO | 02/31892 | 4/2002 |
| WO | 2011/001735 | 1/2011 |

OTHER PUBLICATIONS

Itoh, Takahiro et al., "Preferentially oriented thin-film growth of CuO (1 1 1) and Cu2O(0 0 1) on MgO(0 0 1) substrate by reactive dc-magnetron sputtering", Vacuum 81, pp. 904-910. (Year: 2007).*

International Search Report and Written Opinion for International Application No. PCT/JP2020/010296 mailed on May 13, 2020, 10 pgs.

Lee, et al. "Ultrathin amorphous zinc-tin-oxide buffer layer for enhancing heterojunction interface quality in metal-oxide solar cells", Energy Environ. Sci., 2013, 6, pp. 2112-2118.

Chalapathy, et al. "Fabrication of Cu2ZnSnS4 films by sulfurization of Cu/ZnSn/Cu precursor layers in sulfur atmosphere for Solar cells", Solar Energy Materials & Solar Cells 95 (2011) pp. 3216-3221.

Chinese Notice of Allowance for Chinese Patent Application No. 202080037621.0 dated Apr. 4, 2024.

* cited by examiner

SOLAR CELL, LAMINATED BODY, MULTI-JUNCTION SOLAR CELL, SOLAR CELL MODULE, AND SOLAR POWER GENERATION SYSTEM

CROSS-REFERENCE TO RELATED APPLICATIONS

This application is a Continuation application based upon and claims the benefit of priority from International Application PCT/JP2020/010296, the International Filing Date of which is Mar. 10, 2020, which claims priority to Japanese Patent Application No. JP2019-123900 filed on Jul. 2, 2019, the entire contents of both of which are incorporated herein by reference.

FIELD

Embodiments described herein relate generally to a solar cell, a laminated body, a multi-junction solar cell, a solar cell module, and a solar power generation system.

BACKGROUND

A multi-junction (tandem) solar cell has been known as a high efficient solar cell. In the tandem solar cell, a cell having high spectral sensitivity can be used for each wavelength band, and thus higher efficiency can be accomplished as compared to a single junction solar cell. In addition, a cuprous oxide compound that is inexpensive and has a wide band gap or the like is expected as a top cell of the tandem solar cell.

DETAILED DESCRIPTION

A solar cell according to an embodiment includes a first electrode being transparent, a first semiconductor layer on the first electrode, a second semiconductor layer on the first semiconductor layer, and a second electrode being transparent on the second semiconductor layer. Grooves exist regularly on a surface of the first semiconductor layer facing a second semiconductor layer side.

First Embodiment

Figure 1:
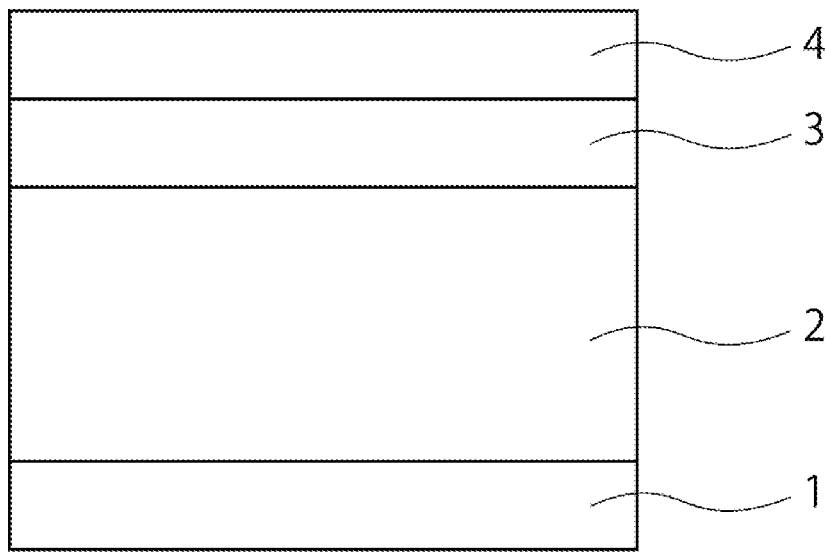
FIG. 1 is a conceptual cross-sectional view of a solar cell according to an embodiment.

A first embodiment relates to a solar cell. FIG. 1 is a conceptual view of a solar cell 100 according to a first embodiment. As shown in FIG. 1, the solar cell 100 according to the present embodiment includes a first electrode 1, a first semiconductor layer 2 on the first electrode 1, a second semiconductor layer 3 on the first semiconductor layer 2, and a second electrode 4 on the second semiconductor layer 3. An intermediate layer (not shown) may be included between the first electrode 1 and the first semiconductor layer 2 or between the second semiconductor layer 3 and the second electrode 4. Light may enter from a side of the first electrode 1 or from a side of the second electrode 4. As light enters the solar cell 100, the solar cell 100 can generate power.

(First Electrode)

The first electrode 1 of the embodiment is a transparent conductive layer provided on a side of the first semiconductor layer 2. In FIG. 1, the first electrode 1 directly contacts the first semiconductor layer 2. A transparent conductive film, a metal film, or an electrode obtained by laminating a transparent conductive film and a metal film is preferable as the first electrode 1. Examples of the transparent conductive film include, but are not particularly limited to, indium tin oxide (ITO), Al-doped zinc oxide (AZO), boron-doped zinc oxide (BZO), gallium-doped zinc oxide (GZO), fluorine-doped tin oxide (FTO), antimony-doped tin oxide (ATO), titanium-doped indium oxide (ITiO), indium zinc oxide (IZO), indium gallium zinc oxide (IGZO), Ta-doped tin oxide ($SnO_2$:Ta), Nb-doped tin oxide ($SnO_2$:Nb), W-doped tin oxide ($SnO_2$:W), Mo-doped tin oxide ($SnO_2$:Mo), F-doped tin oxide ($SnO_2$:F), and hydrogen-doped indium oxide (IOH). The transparent conductive film may be a laminated film having a plurality of films, and a film such as tin oxide may be included in the laminated film in addition to the oxides described above. Examples of a dopant for the film such as tin oxide include, but are not particularly limited to, In, Si, Ge, Ti, Cu, Sb, Nb, F, Ta, W, Mo, F, and Cl. Examples of the metal film include, but are not particularly limited to, films of Mo, Au, Cu, Ag, Al, Ta, and W. Further, the first electrode 1 may be an electrode in which a dot-like, linear, or mesh-like metal is provided on the transparent conductive film. In this case, the dot-like, linear, or mesh-like metal is disposed between the transparent conductive film and the first semiconductor layer 2 or on a side of the transparent conductive film opposite to the first semiconductor layer 2. The dot-like, linear, or mesh-like metal preferably has an aperture ratio of 50% or more with respect to the transparent conductive film. Examples of the dot-like, linear, or mesh-like metal include, but are not particularly limited to, Mo, Au, Cu, Ag, Al, Ta and W. When the metal film is used for the first electrode 1, the thickness of the metal film is preferably less than or equal to about 5 nm in view of transparency. When a linear or mesh-like metal film is used, the transparency is achieved at an aperture, and thus the thickness of the metal film does not need to be less than or equal to about 5 nm.

(First Semiconductor Layer)

The first semiconductor layer 2 of the embodiment is a semiconductor layer disposed between the first electrode 1 and the second semiconductor layer 3. A compound semiconductor layer is preferable as the first semiconductor layer 2. The first semiconductor layer 2 is also referred to as a p-type photoelectric conversion layer. Examples of the first semiconductor layer 2 include a semiconductor layer mainly (90 wt % or more) composed of one selected from the group consisting of cuprous oxide ($Cu_2O$), chalcopyrite semiconductor, kesterite semiconductor, stannite semiconductor, and perovskite semiconductor. More specifically, the first semiconductor layer 2 is a p-type photoelectric conversion layer.

When the thickness of the first semiconductor layer 2 increases, the transmittance decreases. When a film is formed by sputtering, a thickness of 10 micro meter or less is practical. A semiconductor layer mainly composed of cuprous oxide ($Cu_2O$) is preferably used as the compound semiconductor layer. The thickness of the first semiconductor layer 2 is preferably more than or equal to 500 nm and less than or equal to 10 micro meter. As the compound semiconductor layer, the semiconductor layer mainly composed of cuprous oxide or the like may contain an additive. An n-type region may be partially included in the first semiconductor layer 2 on a side of the second semiconductor layer 3.

The compound semiconductor layer is preferably a polycrystal having a large grain diameter in view of the transmittance. The grain diameter (diameter of circumscribed circle) is preferably 90% or more of the thickness of the first semiconductor layer 2. More preferably, the grain diameter is 95% or more of the thickness of the first semiconductor layer 2. As the grain diameter is in these ranges, reflection of light at a grain boundary can be prevented and light can be transmitted efficiently. In addition, in view of the transmittance, on a surface of the first semiconductor layer 2 facing the side of the second semiconductor layer 3, the ratio (number) of crystals satisfying an area of crystal grains (area where grain boundary is boundary, and grooves 5 and recesses and projections are not considered) of 1.0 micro meter$^2$ or more is preferably more than or equal to 80%. When these conditions are satisfied, the first semiconductor layer 2 has excellent transmittance because most of the first semiconductor layer 2 is composed of crystals having a large grain diameter.

Figure 2:
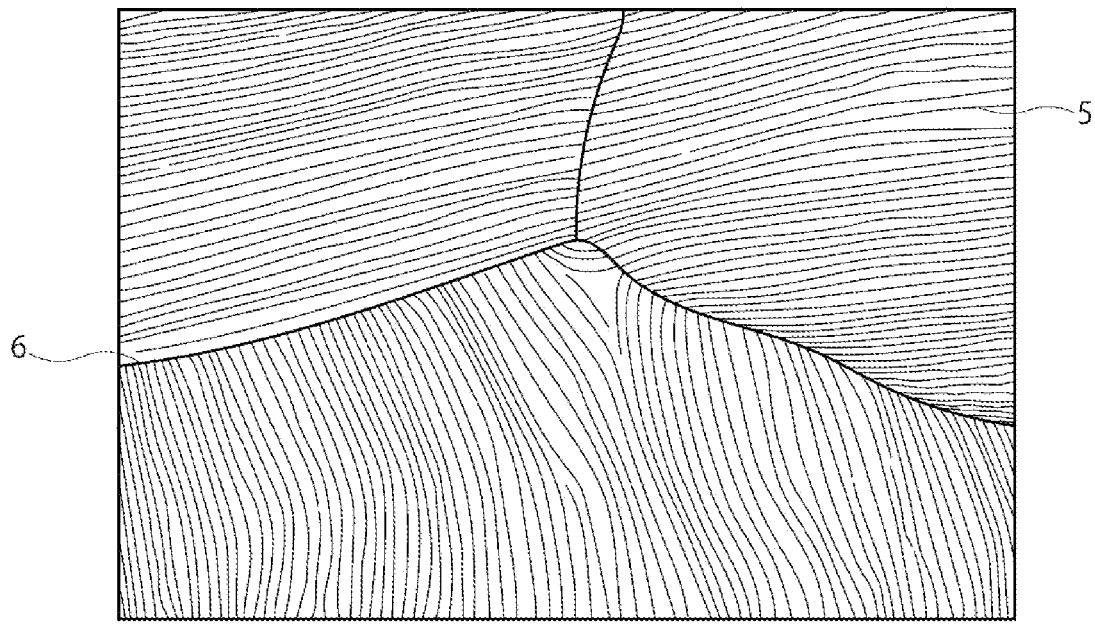
FIG. 2 is a schematic view of a part of the solar cell according to the embodiment.

Regular grooves 5 exist on the surface of the first semiconductor layer 2 facing the second electrode 4 on the side of the second semiconductor layer 3. FIG. 2 is a schematic view of the surface of the first semiconductor layer 2. As shown in FIG. 2, the regular grooves 5 extend in a direction of the grain boundary of the crystal grains in the first semiconductor layer 2 (direction of any one of grain boundaries). Small recesses in grain boundaries 6 and grooves 5 having small surfaces of crystal grains are present on the surface of the first semiconductor layer 2 on the side of the second semiconductor layer 3. The pitch of the grooves 5 (distance between lower ends of grooves) is preferably more than or equal to 1 nm and less than or equal to 50 nm, and more preferably more than or equal to 1 nm and less than or equal to 10 nm. The lower end of the groove is a portion of one groove closest to the first electrode 1. The term "between lower ends" refers to the distance of a line connecting a portion of one groove closest to the first electrode 1 and a portion of another groove closest to the first electrode 1. Further, the depth of the grooves 5 (shortest distance from line connecting upper ends sandwiching lower end of groove to lower end) is more than or equal to 1 nm and less than or equal to 10 nm. The upper end is present between the lower end of one groove and the lower end of a groove adjacent to the one groove. When a perpendicular is drawn from a line connecting the lower ends to the side of the second semiconductor layer 3, at the upper end, the distance between a point where the perpendicular intersects an interface between the first semiconductor layer 2 and the second semiconductor layer 3 and the line is the longest. The average value of the depth of the grooves 5 is preferably less than or equal to a half of the average value of the pitch of the grooves 5. As a plurality of grooves 5 having very small values of pitch and depth are regularly formed on the surface of the first semiconductor layer 2, conversion efficiency and transmittance are improved. As the conversion efficiency is improved, the conversion efficiency of a solar cell itself is improved. However, when the transmittance decreases, it is not preferable as a transmission type solar cell. Because of high transmittance, the solar cell 100 is installed in various locations. When the solar cell 100 is used on a top cell side of a multi-junction solar cell, the amount of power generation on a bottom cell side can be increased and the total amount of power generation can be increased accordingly.

The inventors' study has found that the transmittance and conversion efficiency are improved when the grooves 5 on the surface of the first semiconductor layer 2 are regular, and more preferably, when the grooves 5 are fine and extend in the direction of the grain boundary.

It is not preferable that grooves having a pitch of 1 nm or more and 50 nm or less and a depth of 1 nm or more and 10 nm or less are formed on a small part of the surface of the first semiconductor layer 2 or the grooves 5 are randomly disposed. It has been known that the flatter the surface of a photoelectric conversion layer is, the higher the transmittance is. However, the present disclosure has found that when there is no nanoscale grooves on the surface or when nanoscale grooves are random, not only the transmittance but also the conversion efficiency decreases as compared to a solar cell having the first semiconductor layer 2 in which the regular grooves 5 of the embodiment are formed. For example, if recesses and projections having a height of about several hundred nm (height from upper end of crystal grain to grain boundary with adjacent crystal grain) are present on the surface of the first semiconductor layer 2, light entering the surface of the first semiconductor layer 2 is scattered and thus the transmittance decreases. It is preferable from the viewpoint of obtaining a solar cell having high transmittance and high conversion efficiency that the height of the recesses and projections on the surface of the first semiconductor layer 2 is 10% or less of the thickness of the first semiconductor layer 2, and grooves including regular nanoscale grooves 5 are formed on a surface. The dot-like recess is not included in the grooves 5 of the embodiment because the dot-like recess does not extend in the direction of the grain boundary.

Figure 3:
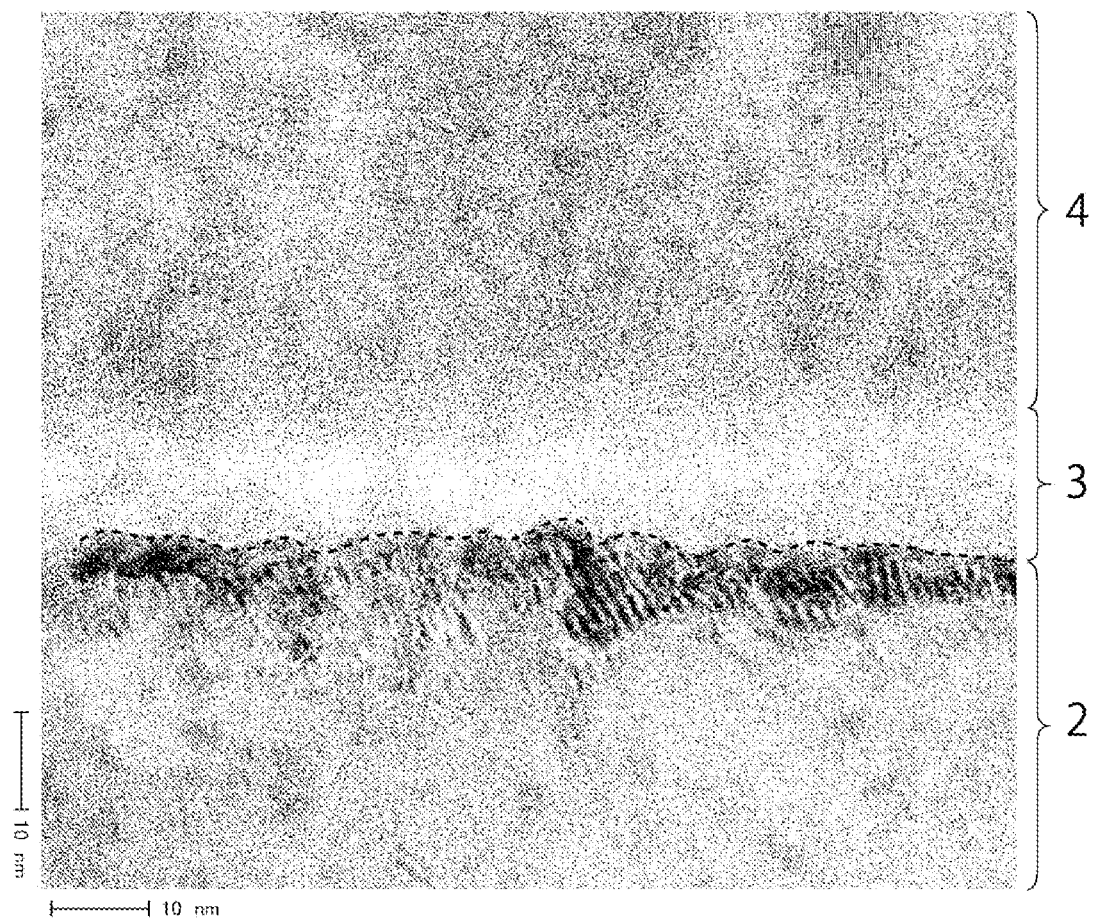
FIG. 3 is a cross-sectional TEM image of the solar cell according to the embodiment.

A method of calculating the pitch and depth of the grooves 5 will be described in detail. FIG. 3 shows an image obtained by observing a boundary portion between the first semiconductor layer 2 and the second semiconductor layer 3 at a magnification of two million using a transmission electron microscope (TEM). The image in FIG. 3 is an image obtained by level-correcting the obtained image (gray scale) (shadow input level of 60, highlight input level of 70, and halftone input level of 1.00). A dashed line in FIG. 3 indicates the position of the interface between the first semiconductor layer 2 and the second semiconductor layer 3. The observation position is preferably at the center of a crystal grain. The H-9500 manufactured by Hitachi High-Technologies Corporation with an accelerating voltage of 200 kV and a magnification accuracy of ±10% or less is used as the TEM.

Regular grooves 5 and irregular grooves, in other words, random grooves can be distinguished as follows. For example, as shown in FIG. 2, the surface of the first semiconductor layer 2 in a member in which the first electrode 1 and the first semiconductor layer 2 are formed (member in which surface of first semiconductor layer 2 opposite to side of first electrode 1 is exposed) is observed with the TEM in a range of 1 micro meter×1 micro meter at a magnification of 100,000, and streak-like grooves 5 are found. Next, when the number of grooves including a portion where angles of grooves (second groove and third groove) sandwiching one groove (first groove) with respect to the one groove (angle of tangent of second groove at measurement site with respect to tangent of first groove at measurement site and angle of tangent of third groove at measurement site with respect to tangent of first groove at measurement site) are within ±10 degrees is 90% or more of the number of grooves found in an observed area, that is, a portion surrounded by grain boundaries, the grooves 5 formed on the surface of the first semiconductor layer 2 are determined to be regular. Note that the angles of the grooves 5 is a direction in which the grooves 5 extends toward the grain boundary, and grooves at ends are omitted when the angle is calculated. In a case of random grooves, the variation in the pitch of the groove does not fall within 10 nm. Consequently, by observing a cross-section using the TEM, it is possible to determine whether the grooves 5 are regular or random. In addition, it is preferable from the viewpoint of the transmittance and conversion efficiency that the regular grooves 5 are formed on 80% or more of the surface area of the entire first semiconductor layer 2. The area where the grooves 5 are present is the area of a region sandwiched by the grooves 5 satisfying the above conditions. In a case of the grooves shown in the schematic view of FIG. 2, about 100% or less of the region corresponds to the area of the grooves. The area is an area that does not include recess portions of the grooves 5, and is an area based on the same concept as the area of crystal grains. The length of the grooves 5 on the surface of the first semiconductor layer 2 is preferably more than or equal to 100 nm, and more preferably more than or equal to 500 nm. Note that the grooves 5 of the embodiment do not substantially intersect. The surface of the first semiconductor layer 2 may some intersecting grooves 5, but the number of the intersecting grooves 5 is at most 10% or less.

The solar cell 100 according to the embodiment preferably has high transmittance of light in a wavelength band of 700 nm or more and 1,000 nm or less. In a case where the transmittance of light in this wavelength band is high, when the solar cell 100 according to the embodiment is used on the top cell side of a multi-junction solar cell and a Si solar cell is used on the bottom cell side, the amount of power generation increases on the bottom cell side. The transmittance of light in the wavelength band of 700 nm or more and 1000 nm or less in the solar cell 100 is preferably more than or equal to 70%, and more preferably more than or equal to 80%.

A method of producing the first semiconductor layer 2 included in the solar cell according to the present embodiment will be described. Hereinafter, a method of producing a semiconductor layer mainly composed of cuprous oxide will be described as an example.

The first semiconductor layer 2 is produced by sputtering. The atmosphere during sputtering is preferably a mixed gas atmosphere of an inert gas such as Ar and an oxygen gas. Although depending on the type of a substrate holding the solar cell 100, the temperature of the substrate is heated to 100° C. or more and 600° C. or less, and sputtering is performed using a target containing Cu. For example, by adjusting the temperature of sputtering and the partial pressure of oxygen, a semiconductor layer including the fine grooves 5 with a large grain diameter can be obtained. If the member formed at a high temperature of 100° C. or higher is rapidly cooled in the air, the grooves 5 on the surface of the first semiconductor layer 2 are lost and the surface is flattened. For this reason, it is preferable to rapidly cool the member under vacuum. The grooves 5 are also flattened easily even under vacuum by performing annealing after the first semiconductor layer 2 is formed. Examples of the substrate used to produce the solar cell 100 include organic substrates such as acrylic, polyimide, polycarbonate, polyethylene terephthalate (PET), polypropylene (PP), and fluororesin (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA)) and polyarylate (PAR), polysulfone (PSF), polyethersulfone (PESU), and polyetherimide (PEI) and inorganic substrate such as lime glass, white plate glass, chemically strengthened glass, and quartz.

Preferably, 95% or more of the first semiconductor layer 2 is composed of cuprous oxide. More preferably, 98% or more of the first semiconductor layer 2 is composed of cuprous oxide. That is, it is preferable that the first semiconductor layer 2 hardly contains (substantially does not contain) a different phase such as CuO or Cu. If the first semiconductor layer 2 does not contain the different phase such as CuO or Cu and is substantially a thin film of a single phase of $Cu_2O$, it is preferable because the first semiconductor layer 2 has very high light-transmitting property. Whether the first semiconductor layer 2 is substantially a single phase of $Cu_2O$ can be determined through measurement by a photo luminescence (PL) method or an X-ray diffraction (XRD) method.

(Second Semiconductor Layer)

The second semiconductor layer 3 is a semiconductor layer disposed between the first semiconductor layer 2 and the second electrode 4. It is preferable that the surface of the second semiconductor layer 3 facing the first semiconductor layer 2 directly contacts the surface of the first semiconductor layer 2 facing the second semiconductor layer 3. The second semiconductor layer 3 is also referred to as an n-type layer or a buffer layer. The second semiconductor layer 3 is preferably an n-type semiconductor layer of oxide or sulfide. The second semiconductor layer 3 is preferably an amorphous thin film. Examples of the oxide used for the second semiconductor layer 3 include, but are not particularly limited to, oxides selected from the group consisting of $Zn_xA_yX_zO_w$ (A is one or more elements selected from the group consisting of Si, Ge, and Sn, M is one or more elements selected from the group consisting of B, Al, Ga, In, and Ge, $0.90 \leq x+y \leq 1.00$, $0.00 \leq z \leq 0.30$, and $0.90 \leq w \leq 1.10$), $Cu_{(2-x)}M_xO$ (M=Mn, Mg, Ca, Zn, Sr, Ba, Al, Ga, In, Nb, and lanthanoid), $Cu_2O:F$, $Cu_2O:N$, $Cu_2O:B$, $Cu_2O:Cl$, $Cu_2O:Br$, $Cu_2O:I$, and $Al_{(2-x)}Ga_xO_3$. Examples of the sulfide used for the second semiconductor layer 3 include, but are not particularly limited to, one or more sulfides selected from the group consisting of $Zn_xIn_{(2-2x)}S_{(3-2x)}$, ZnS, and $In_xGa_{(1-x)}S$. The range of x is $0 \leq x \leq 1$, and the range of y is $0 \leq y \leq 2$.

The thickness of the second semiconductor layer 3 is typically more than or equal to 3 nm and less than or equal to 100 nm. If the thickness of the second semiconductor layer 3 is less than or equal to 5 nm, a leak current may be generated when the coverage of the second semiconductor layer 3 is poor, which may degrade characteristics. When the coverage is good, the thickness is not limited to the above range. If the thickness of the second semiconductor layer 3 exceeds 100 nm, the characteristics may be degraded due to excessively high resistance of the second semiconductor layer 3 or a short-circuit current may be reduced due to a decrease in transmittance. Consequently, the thickness of the second semiconductor layer 3 is more preferably more than or equal to 5 nm and less than or equal to 50 nm or less, and even more preferably more than or equal to 5 nm and less than or equal to 10 nm. To achieve a film with good coverage, the surface roughness of the second semiconductor layer 3 is preferably less than or equal to 5 nm. When the quality of the second semiconductor layer 3 is high, the solar cell 100 operating even with a thickness of about 200 nm can be configured.

The surface of the second semiconductor layer 3 facing the first semiconductor layer 2, the surface forming an interface with the first semiconductor layer 2, has recesses and projections corresponding to the grooves 5 on the surface of the first semiconductor layer 2. The recesses and projections of the second semiconductor layer 3 are also regularly formed like the grooves 5. The pitch of the recesses and projections of the second semiconductor layer 3 is preferably more than or equal to 1 nm and less than or equal to 10 nm, and the height of the recesses and projections is preferably more than or equal to 1 nm and less than or equal to 10 nm. Both the pitch and the height are respectively within the ranges similar to the pitch and depth of the grooves 5.

The second semiconductor layer 3 can be formed by, for example, an atomic layer deposition (ALD) method, a sputtering method, or a chemical vapor deposition (CVD) method.

A conduction band offset ($\Delta E = Ecp - Ecn$) that is a difference between the position (Ecp (eV)) of a conduction band minimum (CBM) of the first semiconductor layer 2 and the position (Ecn (eV)) of a conduction band minimum of the second semiconductor layer 3 is preferably more than or equal to $-0.2$ eV and less than or equal to 0.6 eV ($-0.2$ eV $\leq \Delta E \leq +0.6$ eV). If the conduction band offset is larger than 0, the conduction band at a pn junction interface becomes discontinuous and spikes occur. If the conduction band offset is smaller than 0, the conduction band at the pn junction interface becomes discontinuous and cliffs occur. Both spikes and cliffs are preferably small because the spikes and cliffs act as barriers for photogenerated electrons. Consequently, the conduction band offset is more preferably more than or equal to 0.0 eV and less than or equal to 0.4 eV (0.0 eV $\leq \Delta E \leq +0.4$ eV). However, this does not apply to a case where conduction is performed using a level within a gap. The position of the CBM can be estimated by the following method. The CBM is calculated by actually measuring a valence band maximum (VBM) using photoemission spectroscopy, which is a method of evaluating an electron occupied level, and then assuming the band gap of a material to be measured. However, an ideal interface is not maintained at an actual pn junction interface due to interdiffusion or generation of cation vacancies is not maintained, and thus the band gap may be changed with high possibility. For this reason, it is preferable that the CBM is also evaluated directly by inverse photoemission spectroscopy using the reverse process of photoelectron emission. Specifically, the state of electrons at the pn junction interface can be evaluated by repeating low-energy ion etching, and photoemission spectroscopy measurement and inverse photoemission spectroscopy measurement on the surface of a solar cell.

It is preferable to use a transparent electrode similar to the electrode described for the first electrode 1 as the second electrode 4. Other transparent electrodes such as a multilayer graphene provided with an extraction electrode including a metal wire can also be used as the second electrode 4.

(Antireflection Film)

An antireflection film of the embodiment is a film for facilitating the introduction of light to the first semiconductor layer 2, and is preferably formed on a side of the first electrode 1 or the second electrode 4 opposite to the side of the first semiconductor layer 2. For example, $MgF_2$ and $SiO_2$ are preferably used as the antireflection film. The antireflection film may be be omitted in the embodiment. Although it is necessary to adjust the film thickness according to the refractive index of each layer, it is preferable to deposit a thin film having a thickness of about 70 nm to 130 nm (preferably, 80 nm to 120 nm).

Second Embodiment

Figure 4:
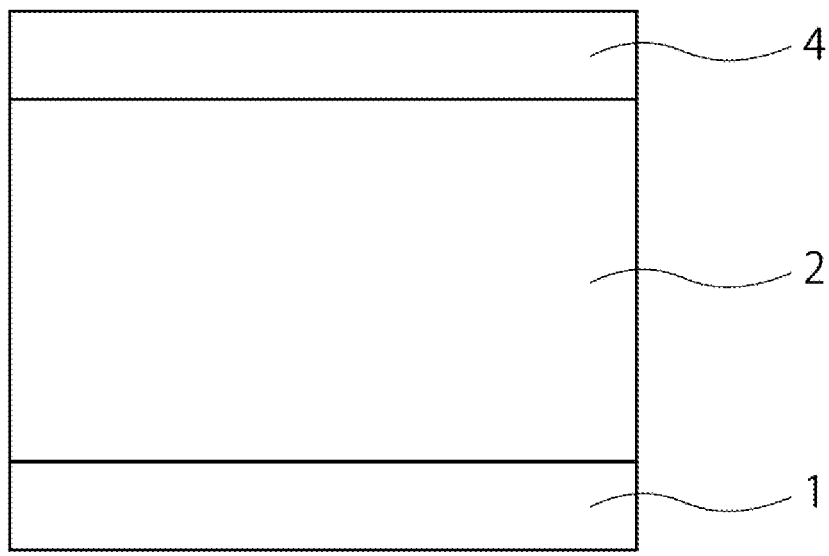
FIG. 4 is a conceptual cross-sectional view of a solar cell according to another embodiment.

A second embodiment relates to a solar cell. FIG. 4 is a conceptual view of a solar cell 101 according to the second embodiment. As shown in FIG. 4, the solar cell 101 according to the present embodiment includes a first electrode 1, a first semiconductor layer 2 on the first electrode 1, and a second electrode 4 on the first semiconductor layer 2. An intermediate layer (not shown) may be included between the first electrode 1 and the first semiconductor layer 2 or the like.

The solar cell 101 according to the second embodiment is different from the solar cell 100 according to the first embodiment in that the solar cell 101 according to the second embodiment does not include the second semiconductor layer 3, and an n-type region is included in the first semiconductor layer 2 on a side of the second electrode 4, which means that the first semiconductor layer 2 has a homojunction. Except for the matters described above, the first embodiment and the second embodiment are common.

The n-type region of the first semiconductor layer 2 preferably contains one or more elements selected from the group consisting of Mn, Mg, Ca, Zn, Sr, Ba, Al, Ga, In, Nb, and lanthanoid. The thickness of the n-type region is typically more than or equal to 5 nm and less than or equal to 100 nm.

The regular grooves 5 described above are formed on a surface of the first semiconductor layer 2 on an n-type region side, the surface facing the second electrode 4. The grooves 5 are similar to those of the first embodiment, and thus a description thereof will be omitted.

Third Embodiment

Figure 5:
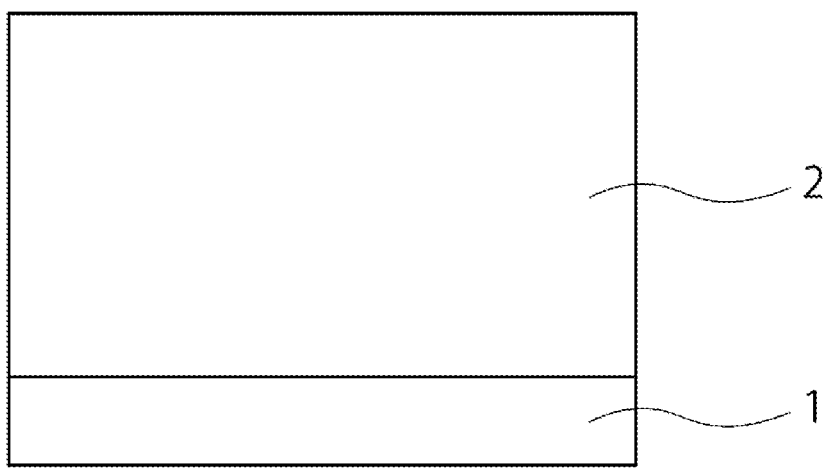
FIG. 5 is a conceptual sectional view of a laminated body according to yet another embodiment.

A third embodiment relates to a laminated body. FIG. 5 is a conceptual view of a laminated body 102 according to the third embodiment. As shown in FIG. 5, the laminated body 102 according to the present embodiment includes a first electrode 1 and a first semiconductor layer 2 on the first electrode 1. Grooves 5 are formed on a surface of the first semiconductor layer 2 opposite to a side of the first electrode 1. The third embodiment is common to the first embodiment except that the second semiconductor layer 3 and the second electrode 4 are not included.

Fourth Embodiment

Figure 6:
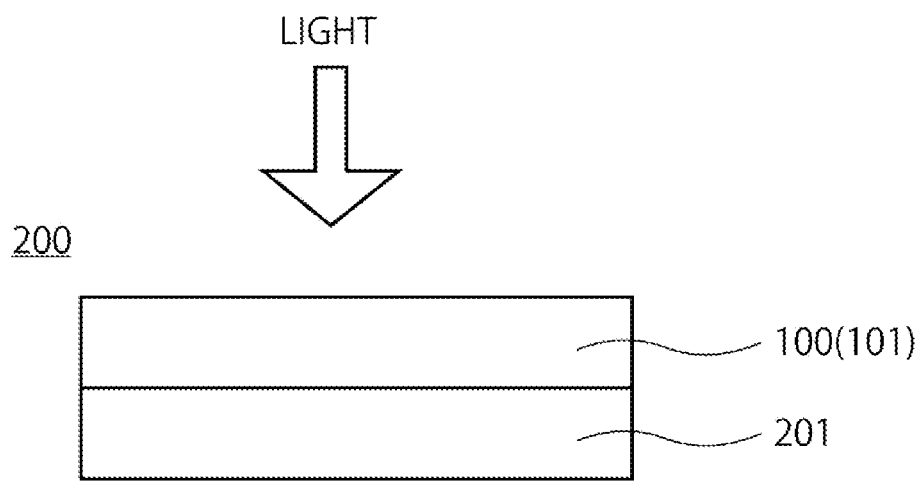
FIG. 6 is a conceptual cross-sectional view of a multi-junction solar cell according to still another embodiment.

A fourth embodiment relates to a multi-junction solar cell. FIG. 6 is a conceptual cross-sectional view of a multi-junction solar cell 200 according to the fourth embodiment. The multi-junction solar cell 200 shown in FIG. 6 includes the solar cell (first solar cell) 100 according to the first embodiment on a light incident side and a second solar cell 201. The band gap of a photoelectric conversion layer in the second solar cell 201 is smaller than the band gap of the first semiconductor layer 2 in the solar cell 100 according to the first embodiment. The multi-junction solar cell according to the embodiment includes a solar cell obtained by joining three or more solar cells. Note that the solar cell 101 according to the second embodiment can be used instead of the solar cell 100 according to the first embodiment.

Since the band gap of the first semiconductor layer 2 in the solar cell 101 according to the second embodiment is about 2.0 eV, the band gap of the photoelectric conversion layer in the second solar cell 201 is preferably more than or equal to 1.0 eV and less than or equal to 1.4 eV. As the photoelectric conversion layer of the second solar cell 201, a compound semiconductor layer composed of one or more of a CIGS-based layer having a high In content, a CIT-based layer, a CdTe-based layer, and a copper oxide-based layer, or crystalline silicon is preferable.

By using the solar cell 100 according to the first embodiment as the first solar cell, it is possible to prevent the conversion efficiency of a bottom cell (second solar cell) from decreasing because the first solar cell absorbs light in an unintended wavelength range. As a result, an efficient multi-junction solar cell is achieved.

Fifth Embodiment

Figure 7:
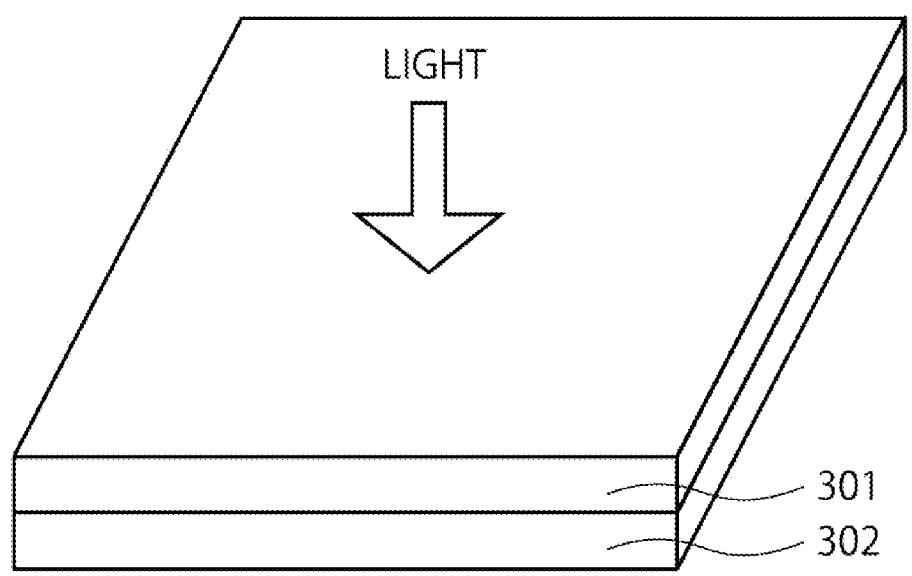
FIG. 7 is a conceptual view of a solar cell module according to a further embodiment.

A fifth embodiment relates to a solar cell module. FIG. 7 is a conceptual perspective view of a solar cell module 300 according to the fifth embodiment. The solar cell module 300 shown in FIG. 7 is a solar cell module obtained by stacking a first solar cell module 301 and a second solar cell module 302. The first solar cell module 301 is provided on a light incident side, the first solar cell module 301 using the solar cell 100 according to the first embodiment or the solar cell 101 according to the second embodiment. It is preferable to use the second solar cell 201 for the second solar cell module 302.

Figure 8:
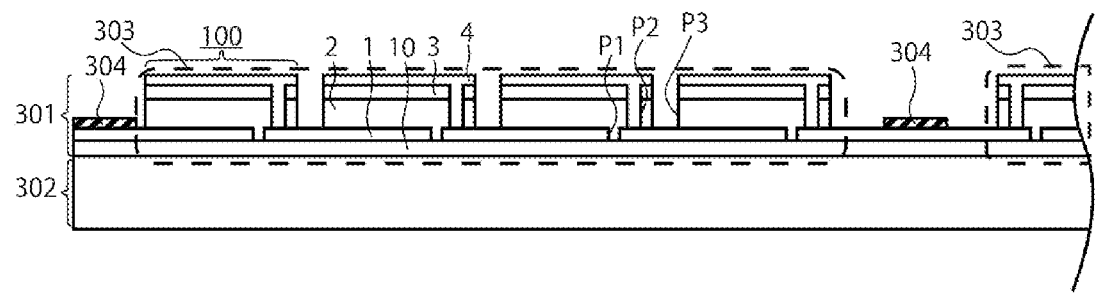
FIG. 8 is a conceptual cross-sectional view of the solar cell module according to a still further embodiment.

FIG. 8 is a conceptual cross-sectional view of the solar cell module 300. In FIG. 8, the structure of the first solar cell module 301 is shown in detail, but the structure of the second solar cell module 302 is not shown. In the second solar cell module 302, the structure of a solar cell module is appropriately selected according to a photoelectric conversion layer of a solar cell to be used. The solar cell module shown in FIG. 8 includes a plurality of sub-modules 303 surrounded by a dashed line in which a plurality of the solar cells 100 (solar cells) are arranged in a horizontal direction and electrically connected in series, and the sub-modules 303 are electrically connected in parallel or in series.

The solar cell 100 is scribed, and the solar cells 100 adjacent to each other are connected at the second electrode 4 on an upper side and the first electrode 1 on a lower side. The solar cell 100 according to the fifth embodiment also includes a substrate 10, a first electrode 1, a first semiconductor layer 2, a second semiconductor layer 3, and a second electrode 4, similarly to the solar cell 100 according to the first embodiment.

If the output voltage is different for each module, a current may flow backward to a portion with low voltage or excessive heat may be generated, resulting in a decrease in the output of the module.

In addition, using the solar cell according to the present application makes it possible to use a solar cell suitable for each wavelength band. It is thus preferable because it is possible to generate power more efficiently than a case where a solar cell functioning as a top cell or a bottom cell is used alone, and the overall output of the module is increased.

If the conversion efficiency of the entire module is high, the ratio of energy converted into heat to light energy irradiated can be reduced. It is thus possible to prevent a decrease in efficiency due to an increase in the temperature of the entire module.

Sixth Embodiment

Figure 9:
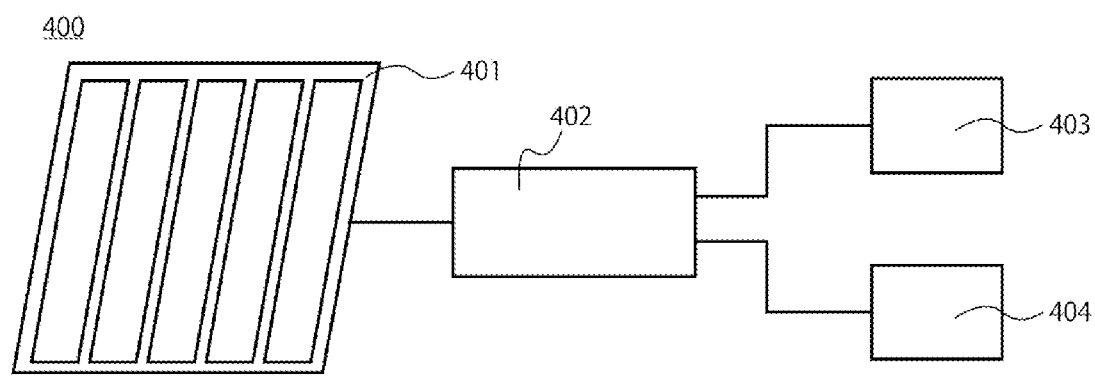
FIG. 9 is a conceptual view of a solar power generation system according to a still further embodiment.

A sixth embodiment relates to a solar power generation system. The solar cell module 300 according to the fifth embodiment can be used as a power generator for generating power in the solar power generation system according to the sixth embodiment. The solar power generation system according to the embodiment generates power using a solar cell module. Specifically, the solar power generation system includes a solar cell module that generates power, a unit that converts electricity generated into power, and a power storage unit that stores electricity generated or a load that consumes electricity generated. FIG. 9 is a conceptual configuration view of a solar power generation system 400 according to the embodiment. The solar power generation system shown in FIG. 9 includes a solar cell module 401 (300), a power conversion device 402, a storage battery 403, and a load 404. One of the storage battery 403 and the load 404 may be omitted. The load 404 may be configured to be capable of using the electric energy stored in the storage battery 403. The power conversion device 402 is a device including a circuit or an element that performs power conversion such as voltage transformation or DC/AC conversion. The configuration of the power conversion device 402 may be appropriately selected according to a voltage generated and the configuration of the storage battery 403 and the load 404.

Solar cells included in the sub-module 303 having received light, the sub-module 303 being included in the solar cell module 300, generate power, and the electric energy is converted by the converter 402, and stored in the storage battery 403 or consumed by the load 404. Preferably, the solar cell module 401 is additionally provided with a solar tracking driving device for constantly directing the solar cell module 401 to the sun, a light collector for collecting sunlight, a device for improving power generation efficiency, and the like.

The solar power generation system 400 is preferably used for real estate such as dwellings, commercial facilities, and factories, or used for movable property such as vehicles, aircrafts, and electronic devices. By using the solar cell with excellent conversion efficiency according to the embodiment for the solar cell module 401, an increase in power generation is expected.

Figure 10:
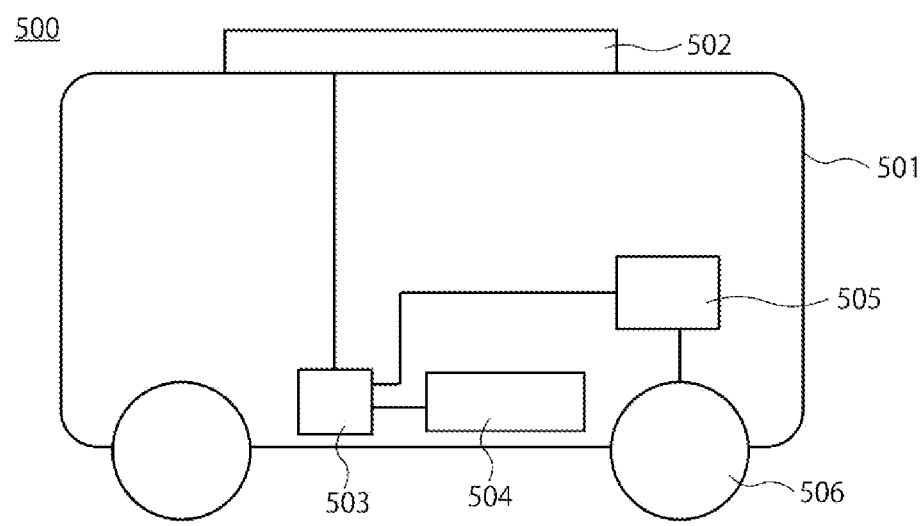
FIG. 10 is a conceptual view of a vehicle according to a still further embodiment.

A vehicle is shown as an example of using the solar power generation system 400. FIG. 10 is a conceptual configuration view of a vehicle 500. The vehicle 500 shown in FIG. 10 includes a vehicle body 501, a solar cell module 502, a power conversion device 503, a storage battery 504, a motor 505, and tires (wheels) 506. The power generated by the solar cell module 502 provided on the top of the vehicle body 501 is converted by the power conversion device 503 and charged by the storage battery 504, or is consumed by a load such as the motor 505. The vehicle 500 can be moved by the motor 505 rotating the tires (wheels) 506 using electric power supplied from the solar cell module 502 or the storage battery 504. The solar cell module 502 does not need to be a multi-junction type, and may be constituted only by the first solar cell module including the solar cell 100 according to the first embodiment or the solar cell 101 according to the second embodiment. When the solar cell module 502 that is transparent is employed, it is also preferable to use not only the solar cell module 502 on the top of the vehicle body 501 but also the solar cell module 502 functioning as a power generating window on a side surface of the vehicle body 501.

Hereinafter, the present disclosure will be described more specifically based on examples, but the present disclosure is not limited to the following examples.

Example 1

On a white glass substrate, an ITO transparent conductive film is deposited as a first electrode on a back side, and a Sb-doped $SnO_2$ transparent conductive film is deposited on the ITO transparent conductive film. The substrate is heated at 450° C. by sputtering in a mixed gas atmosphere of oxygen and argon gas to form a film of a cuprous oxide compound on the transparent first electrode, and then cooled under mild conditions. N-type $Zn_{0.8}Ge_{0.2}O_x$ is deposited on the p-cuprous oxide layer by an electron deposition method. Thereafter, an AZO transparent conductive film is deposited as a second electrode on a front side. $MgF_2$ is then deposited on the AZO transparent conductive film as an antireflection film, so that a solar cell is obtained.

Example 2

On a white glass substrate, an ITO transparent conductive film is deposited as the first electrode on the back side, and a Sb-doped $SnO_2$ transparent conductive film is deposited on the ITO transparent conductive film. The substrate is heated at 600° C. by sputtering in a mixed gas atmosphere of oxygen and argon gas to form a film of a cuprous oxide compound on the transparent first electrode, and then cooled under mild conditions. N-type $Zn_{0.8}Ge_{0.2}O_x$ is deposited on the p-cuprous oxide layer by an electron deposition method. Thereafter, an AZO transparent conductive film is deposited as the second electrode on the front side. $MgF_2$ is then deposited on the AZO transparent conductive film as the antireflection film, so that a solar cell is obtained.

Example 3

On a white glass substrate, an ITO transparent conductive film is deposited as the first electrode on the back side, and a Sb-doped $SnO_2$ transparent conductive film is deposited on the ITO transparent conductive film. The substrate is heated at 300° C. by sputtering in a mixed gas atmosphere of oxygen and argon gas to form a film of a cuprous oxide compound on the transparent first electrode, and then cooled under mild conditions. N-type $Zn_{0.8}Ge_{0.2}O_x$ is deposited on the p-cuprous oxide layer by an electron deposition method. Thereafter, an AZO transparent conductive film is deposited as the second electrode on the front side. $MgF_2$ is then deposited on the AZO transparent conductive film as the antireflection film, so that a solar cell is obtained.

Comparative Example 1

A solar cell is obtained under the same conditions as in the example 1 except that the substrate is quenched in the air after a film of a cuprous oxide compound is formed.

Comparative Example 2

A solar cell is obtained under the same conditions as in the example 2 except that the substrate is quenched in the air after a film of a cuprous oxide compound is formed.

Comparative Example 3

A solar cell is obtained under the same conditions as in the example 3 except that the substrate is quenched in the air after a film of a cuprous oxide compound is formed.

Comparative Example 4

A solar cell is obtained under the same conditions as in the example 1 except that vacuum annealing is performed after a film of a cuprous oxide compound is formed.

Regular grooves are formed in the solar cells of the examples, but no regular grooves are formed in the solar cells of the comparative examples. More specifically, grooves are hardly found in the solar cells of the comparative examples 1 to 3. In the solar cell of comparative example 4, irregular grooves are partially formed, and the pitch and depth of the grooves are not within an appropriate range. The transmittance and conversion efficiency of the solar cell of the comparative example 4 in which no regular grooves are formed are inferior to those of the solar cells of the examples. The pitch and depth of the grooves of the solar cells of the examples are within an appropriate range, and the regular grooves contribute to the improvement of the characteristics of the solar cells. By forming regular grooves on the surface of the first semiconductor layer, a solar cell having higher transmittance and conversion efficiency than a solar cell that has the same configuration but does not have regular grooves can be obtained. To form regular grooves, it is preferable to cool the substrate under mild conditions after a film of a cuprous oxide compound is formed. As a solar cell using cuprous oxide has excellent transmittance, in a multi-junction solar cell that uses the solar cell using cuprous oxide as a top cell, this solar cell also contributes to an increase in power generation of the entire solar cell.

In the specification, some elements are represented only by element symbols.

Although the embodiments of the present disclosure have been described above, the present disclosure is not construed as being limited to the embodiments described above. When the present disclosure is carried out, the present disclosure can be embodied by modifying constituent elements without departing from the scope of the disclosure. Further, various disclosures can be formed by appropriately combining a plurality of constituent elements disclosed in the above embodiments. For example, constituent elements of different embodiments may be appropriately combined as in a modification.

What is claimed is:

1. A solar cell comprising:
   a first electrode that is transparent;
   a first semiconductor layer on the first electrode;
   a second semiconductor layer on the first semiconductor layer; and
   a second electrode being transparent on the second semiconductor layer, wherein
   grooves are disposed on a surface of the first semiconductor layer facing a second semiconductor layer side,
   recesses in grain boundaries of crystal grains are disposed on the surface of the first semiconductor layer facing the second semiconductor layer side,
   90 wt % or greater of the first semiconductor layer is composed of $Cu_2O$,
   the grooves extend towards one side of the recesses from another side of the recesses, and
   the grooves are disposed inside an area surrounded by the recesses.

2. The solar cell according to claim 1, wherein the grooves have a pitch of 1 nm or more and 50 nm or less.

3. The solar cell according to claim 1, wherein the grooves have a depth of 1 nm or more and 10 nm or less.

4. The solar cell according to claim 1, wherein the first semiconductor layer has a thickness of 10 micro meter or less.

5. The solar cell according to claim 1, wherein a transmittance of light in a wavelength band of 700 nm or more and 1,000 nm or less is more than or equal to 70%.

6. A multi-junction solar cell comprising the solar cell according to claim 1.

7. A solar cell module comprising the solar cell according to claim 1.

8. A solar power generation system configured to generate power using the solar cell module according to claim 7.

9. The solar cell according to claim 1, wherein a ratio of a quantity of crystals satisfying an area of crystal grains of 1.0 $\mu m^2$ or greater is greater than or equal to 80%.

10. The solar cell according to claim 1, wherein a length of the grooves is greater than or equal to 100 nm.

11. The solar cell according to claim 1, wherein a quantity of the grooves that intersect is 10% or less.

12. The solar cell according to claim 1, wherein the grooves do not intersect.

* * * * *